United States Patent [19]
Derkits, Jr.

[11] Patent Number: 4,755,663
[45] Date of Patent: Jul. 5, 1988

[54] TEXTURED SURFACE, GRADED GAP SWITCH FOR TRANSMISSION LINE OPTICAL DETECTORS

[75] Inventor: Gustav E. Derkits, Jr., New Providence, N.J.

[73] Assignee: Bell Communications Research, Inc., Livingston, N.J.

[21] Appl. No.: 939,169

[22] Filed: Dec. 8, 1986

[51] Int. Cl.⁴ .............................................. H01J 40/14
[52] U.S. Cl. ................................................ 250/211 J
[58] Field of Search ................ 250/551, 211 J, 211 K, 250/211 R; 357/30, 55, 63, 61

[56] References Cited

U.S. PATENT DOCUMENTS

| | | | |
|---|---|---|---|
| 3,917,943 | 11/1975 | Auston | 250/211 |
| 4,371,232 | 2/1983 | Jensen et al. | 357/30 |
| 4,383,269 | 5/1983 | Capasso | 357/30 |
| 4,494,132 | 1/1985 | Kohn | 357/30 |
| 4,514,582 | 4/1985 | Tiedje et al. | 357/30 |
| 4,555,622 | 11/1985 | Glass et al. | 357/30 |
| 4,558,336 | 12/1985 | Chang et al. | 357/30 |
| 4,626,613 | 12/1986 | Wenham et al. | 357/30 |

FOREIGN PATENT DOCUMENTS 0166083 10/1982 Japan ...................................... 357/30

OTHER PUBLICATIONS

"Optical Switch", IBM Technical Disclosure Bulletin, vol. 29, No. 6, 11/86, pp. 2708-2709.

Primary Examiner—David C. Nelms
Assistant Examiner—Michael Messinger
Attorney, Agent, or Firm—James W. Falk

[57] ABSTRACT

An optical switch is formed by a microstrip transmission line on the surface of a photoconductive semiconductor medium. The transmission line has a small gap which produces an open circuit between a microwave (or other electrical signal) source and a detector connected at opposite ends of the line. This gap is filled (and the microwave circuit thereby completed) by copious electrical charges which are generated in a semiconductor surface region across the gap in response to optical radiation. The gap is composed of a textured surface graded composition photosensitive semiconductor material to provide high speed and reduced noise.

3 Claims, 1 Drawing Sheet

TEXTURED SURFACE, GRADED GAP SWITCH FOR TRANSMISSION LINE OPTICAL DETECTORS

BACKGROUND OF THE INVENTION

1. Field of the Invention

This invention relates to the field of semiconductor apparatus, and more particularly to optically controlled semiconductor devices for high speed switching of electrical signals.

2. Description of the Prior Art

Optical switches are known in the prior art that are fabricated from a body of semiconductor material including a pair of opposed major surfaces, on one of which is located a ground plane, and on the other of which is located a broken electrode microstrip transmission line, that is, a microstrip with a gap in the line. The gap may be completed by electrical charges generated in a surface region across the gap which is responsive to a beam of light. An example of such a switch is described in U.S. Pat. No. 3,917,943 of Auston. The semiconductor body in the Auston switch is characterized by uniform high resistivity which is sufficient to cause the semiconductor to behave as a dielectric with respect to electrical signals propagating along the microstrip transmission line. The device operates as a switch when a first optical beam is directed at the gap, thereby generating copious electronic charges at the surface of the semiconductor sufficient to increase significantly the conductance across the gap, and thus closing the electrical circuit at the gap between the broken portions of the electrode microstrip line. The optical beam is sufficiently intense to cause a sudden decrease of the d.c. resistance along the semiconductor surface across the gap to a value well below the characteristic impedance of the microstrip transmission line. As a result, the microstrip transmission line circuit is thereby closed (switched ON), enabling electrical signals to pass from an input electrical source to an output electrical detector located at opposed ends of the microstrip line. Then, a short predetermined time interval after commencement of the first optical beam, a second optical beam is directed at the gap in the microstrip line. This second beam causes the generation of copious electronic charges in the bulk of the semiconductor body down to the ground plane. The microstrip line at the gap is thus short-circuited to the ground plane (switched OFF), quickly terminating the flow of electrical signal energy from the input electrical generator to the output electrical detector.

The disadvantage of the Auston type optical switch known in the prior art is that the electrical impulse created by the optical pulse is one dominated by carrier recombination, rather than carrier transport.

SUMMARY OF THE INVENTION

Briefly, and in general terms, the present invention provides an optical switch formed from a body of semiconductor material having a major surface upon which is located a pair of electrode segments separated by a gap. A region is provided between the electrode segments in the region of the gap which is composed of a textured surface graded-composition photosensitive semiconductor material so that if a beam of radiation is directed at the gap sufficient to produce charge carriers at the surface of the region of semiconductor material, the electrical conductivity across the gap is significantly increased and an electrical contact is completed between said segments.

The novel features which are considered as characteristic of the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENT

Figure 1:
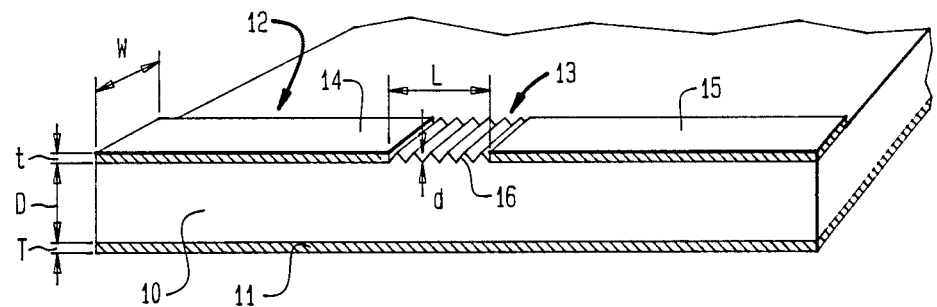
FIG. 1 is a highly simplified cross-sectional view of the optical switch according to the present invention.

FIG. 1 illustrates the optical switch according to the present invention. More particularly, the switch is formed from a monocrystalline semiconductor body 10, preferably silicon, which is provided on its bottom surface with a ground plane electrode 11 and on its top surface with a microstrip transmission line electrode 12 having a gap 13. This gap is typically of length L about 0.2 mm and is situated between two segments 14 and 15 of the electrode 12. The electrode 12 is advantageously an aluminum strip having a thickness in the range of 500 to 10,000 angstroms, typically 5,000 angstroms. The ground plane electrode 11 is also preferably composed of aluminum with a similar thickness. It is important that the electrodes 11 and 12 both make good ohmic (nonrectifying) contact with the semiconductor body 10. To this end, heat treatment of the aluminum electrodes on the surface of the semiconductor at about 550° C. in nitrogen for about ten minutes can be utilized; or else other methods and other electrode materials for achieving ohmic contact can be used, as known in the art.

As noted above, FIG. 1 shows the first transmission line segment 14 and second transmission line segment 15 separated by the gap 13. More particularly, directly below the gap 13 there is shown a textured-surface graded-composition photosensitive region of semiconductor material 16 which is an especially advantageous feature of the present invention.

An optical switch is formed by a microstrip transmission line on the surface of a photoconductive semiconductor medium. The transmission line has a small gap which produces an open circuit between a microwave (or other electrical signal) source and a detector connected at opposite ends of the line. This gap is filled (and the microwave circuit thereby completed) by copious electrical charges which are generated in a semiconductor surface region across the gap in response to optical radiation. The gap is composed of a textured surface graded composition photosensitive semiconductor material to provide high speed and reduced noise.

In FIG. 1 the following letters represent the dimensions of various elements of the optical switch:

t = thickness of upper metallization (transmission line electrode);

T = thickness of backside metallization;

W = width of upper transmission line segments;

D = substrate thickness;
L = length of transmission line gap;
d = thickness of graded composition region;

In the preferred embodiment of the present invention, the range of values for these various elements may be chosen by those skilled in the art for the particular applications intended.

Figure 2:
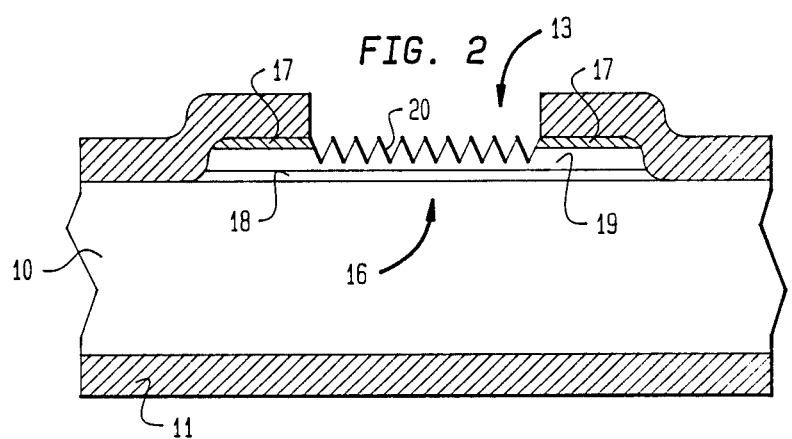
FIG. 2 is an enlarged view of a portion of the optical switch of FIG. 1 in the region of the gap.

Turning next to FIG. 2 there is shown an enlarged view of a portion of the optical switch according to the present invention in the region of the gap 13 between the first transmission line segment 14 and the second transmission line segment 15. FIG. 2 also illustrates the backside ground plane metallization 11 and the semiconductor body 10 as in FIG. 1, and the textured surface graded composition photosensitive semiconductor material 16 as in FIG. 1.

An ohmic contact region 17 making contact from the transmission line to the top surface of a narrow energy gap semiconductor is also shown. The ohmic contact region is preferably composed of suitable material compatible with the transmission line and semiconductor and is deposited by techniques known in the art.

A wide energy gap semiconductor layer 18 is provided epitaxial to the substrate 10. A graded-composition semiconductor alloy 19 is disposed on the upper surface of the semiconductor layer 18 and is composed of a semiconductor alloy having a composition which is a mixture of two semiconductors N and W, semiconductor N having a narrow energy band gap and semiconductor W having a wide energy band gap so that the concentration per unit volume x of M of narrow gap semiconductor material varies from 0 at the junction of the wide energy band gap semiconductor layer 18 and the layer 19 of semiconductor alloy to the value of 1 at the upper major surface of the layer 19 of semiconductor alloy. The semiconductor alloy 19 is deposited by techniques known to those skilled in the art.

The Figure also illustrates grooves 20 extending into graded composition alloy 19, which are formed by techniques known in the art. The grooves 20 or other texture cut into the graded material 19 serve as charge separators. A ray of light falling on the gap 13 causes the creation of charge carriers (electrons and holes) which constitute a current-carrying medium causing an electrical short circuit between segments 14 and 15. The circuit turns itself off when the light is extinguished by the effect of the quasi-electric field which sweeps the charge carriers into the narrow bandgap material at the front surface.

The device described in this invention can be fabricated by growth of suitable epitaxial layers, fabrication of a textured surface and deposition of metal contacts, as detailed below.

The epitaxial layers described in the designs of this device can be grown by, e.g., molecular beam epitaxy (MBE). The various elements which constitute the composite semiconductor layers are introduced by means of molecular beams which are directed onto the substrate of a heated substrate (e.g., GaAs), under high vacuum. For the case of an AlGaAs layer, the beams consist of Ga, Al and As atoms. The relative composition of the elements in the grown layers can be determined by adjusting the molecular beam intensities, e.g., by varying the temperature of their sources. In particular, the graded gap layer in the device can be made by varying the concentration of the Al atoms in the AlGaAs semiconductor.

The textured surface can be made by first preparing a mask, patterned in a desired way, on top of the surface to be textured, and then by etching this surface through this mask. The mask is made by applying a thin layer (~0.2 μm) of light-sensitive material (e.g., Shipley AZ-13503 photoresist) into the surface. The photoresist film is then exposed by an interference pattern formed by two intersecting beams of a blue or ultraviolet laser (e.g., HeCd laser). Development of the photoresist results in the formation of a mask consisting of stripes arranged periodically. Subsequent etching of the sample (e.g., with a beam of As ions) results in the formation of periodic corrugations on the semiconductor surface. The period $\bigwedge$ of these corrugations is determined by the laser wavelength $\lambda$ and the angle between the intersecting beams $\theta$ and is given by $\bigwedge = \lambda/2S = (\theta/2)$.

The contacts for this device can be made by evaporating a thin film (a few thousand Å thick) of metal (e.g., gold) on the surface of the upper epitaxial layer. The contact can be patterned in a desired way by applying photoresist on top of the metal film, patterning the photoresist by exposing it through a mask with the desired pattern, and then etching the metal through the photoresist mask.

Figure 3:
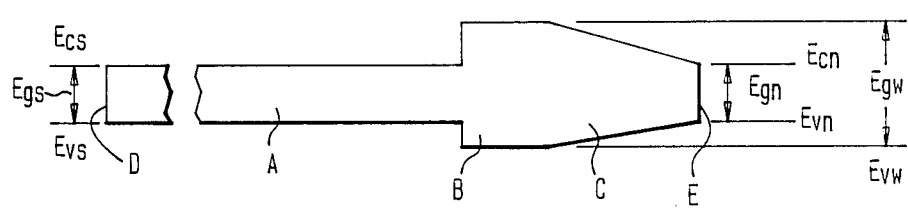
FIG. 3 is an energy band diagram of the energy levels in the optical switch according to the present invention.

FIG. 3 shows a typical configuration of energy bands which would be achieved in the structure according to the present invention.

More particularly, FIG. 3 is an energy band diagram of the device according to the present invention in operation, depicting at position A the energy level representing the semi-insulating substrate 10, with the wide-energy gap semiconductor region 18 being represented at position B, and the graded composition alloy semiconductor 19 being represented at position C.

Position D in FIG. 3 represents the energy level at the ground plane electrode 11 of substrate 10, while position E represents the exposed surface of the narrow energy gap semiconductor alloy 19.

The following terms represent the energy band nomenclature in the Figure:

$E_{cs}$ = substrate conduction band minimum;
$E_{cw}$ = wide gap semiconductor conduction band minimum;
$E_{cn}$ = narrow gap semiconductor conduction band minimum;
$E_{vs}$ = substrate valence band maximum;
$E_{vw}$ = wide gap semiconductor valence band maximum;
$E_{vn}$ = narrow energy gap semiconductor valence band maximum;
$E_{gs}$ = substrate energy gap = $E_{cs} - E_{vs}$;
$E_{gw}$ = wide band energy gap = $E_{cw} - E_{vw}$;
$E_{gn}$ = narrow band energy gap = $E_{cn} - E_{vn}$.

The present invention is distinctly different from those in the prior art in several ways. First, a different physical process is used to provide a turn-off of the conductivity in the gap, to wit-carrier transport in a material of graded composition, as opposed to carrier recombination induced by damage, or short circuit of the gap by a second laser pulse. The use of carrier transport enhances the performance of such devices by providing a faster physical mechanism for the turnoff of conductivity and by decoupling the conductivity of the medium from the turn-off time, allowing maximum conductivity. Second, the use of a textured medium in the gap has the dual effect of enhancing the light absorbing power of the gap and also of providing a means of separating carriers after the cessation of illumination.

Third, the provision of variable composition material allows an enhancement of ohmic contacts between the transmission line and the gap, resulting in reduced resistance and hence improved speed and lower noise performance. Fourth, the use of variable composition material allows for gain in these devices under appropriate bias conditions, resulting in enhanced optical quantum efficiency. For these reasons, the invention described here, while it attacks the same problem as those in the prior art—that of providing a high-speed, optically-triggered detector and electrical switch—does so by means of such a different nature as to render it a different device, and results in improved performance and greater applicability to integrated optoelectronic circuitry.

While the invention has been illustrated and described as embodied in a textured surface, graded gap switch for transmission line optical detectors, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. An optical switch comprising:
   a body of semiconductor material having a major surface upon which is located a pair of electrode segments separated by a gap and including a graded composition photosensitive semiconductor material in said gap, said graded composition material having an exposed surface in said gap and having narrow bandgap material predominently at said exposed surface thereof whereby the presence of light falling on said gap causes the creation of charge carriers in said gap to effect an electrical short circuit between said electrode segments and cessation of light turns off the switch by sweeping the charge carriers into said narrow bandgap material.

2. An optical switch in accordance with claim 1 wherein a plurality of grooves are present on said exposed surface of the graded composition material and function as charge separators when a potential is applied to the switch.

3. An optical switch comprising:
   a substrate composed of monocrystalline semiconductor material having first and second major surfaces;
   a first layer of semiconductor material having a wide energy gap disposed on said first major surface of said substrate;
   a second layer of semiconductor material disposed on said first layer, said second layer having first and second major surfaces, said second layer composed of a semiconductor alloy which is a mixture of two semiconductor materials N and W, semiconductor material N having a narrow energy bandgap and semiconductor material W having a wide energy bandgap, wherein the concentration per unit volume of semiconductor N varies from 0 at said first major surface of the second layer at the junction of said first and said second layers to the value 1 at said second major surface of said second layer;
   a pair of electrodes disposed on said second major surface of said second layer and separated by a gap such that a portion of said second major surface of said second layer is exposed in said gap between said pair of electrodes;
   said portion of the second major surface of said second layer including grooves extending into said second layer functioning as charge separators when a potential is applied to said electrodes so that if a beam of radiation of sufficient energy is directed at said gap, charge carriers are formed at said second major surface of said second layer and the electrical conductivity across the gap is significantly increased so as to form an electrical connection between said pair of electrodes, while cessation of said beam of radiation directed at said gap results in charge carriers being swept in said second layer into said semiconductor material with a narrow energy bandgap thereby turning off the electrical connection between said pair of electrodes.

* * * * *